(12) United States Patent
Yu (10) Patent No.: US 10,355,670 B1
(45) Date of Patent: Jul. 16, 2019

(54) ACTIVE SUPPRESSION CONTROLLER WITH TRACKING AND CORRECTION FOR MULTIPLE TIME-VARYING FUNDAMENTAL FREQUENCIES

(71) Applicant: Baisheng Yu, Erie, PA (US)

(72) Inventor: Baisheng Yu, Erie, PA (US)

(*) Notice: Subject to any disclaimer, the term of this patent is extended or adjusted under 35 U.S.C. 154(b) by 0 days.

(21) Appl. No.: 15/972,130

(22) Filed: May 5, 2018

(51) Int. Cl.
*H03J 7/04* (2006.01)
*H03J 1/00* (2006.01)
*G05B 13/04* (2006.01)
*G01R 19/25* (2006.01)
*F16F 15/00* (2006.01)

(52) U.S. Cl.
CPC .......... *H03J 7/04* (2013.01); *F16F 15/002* (2013.01); *G01R 19/2509* (2013.01); *G05B 13/041* (2013.01); *G05B 13/042* (2013.01); *G05B 13/047* (2013.01); *H03J 1/0008* (2013.01); *H03J 2200/36* (2013.01)

(58) Field of Classification Search
None
See application file for complete search history.

(56) References Cited

U.S. PATENT DOCUMENTS 7,403,367 B2 * 7/2008 Yasuda .................. F16F 13/26
361/139

* cited by examiner

*Primary Examiner* — Jeffery S Zweizig (57) ABSTRACT

Provided an active suppression controller with an adaptive algorithm capable of tracking the fluctuation of multi-fundamental frequencies and correcting them while the deviation is divergence based on the DXHS (Delayed-X Harmonics Synthesizer). It includes a controller's architecture, an adaptive frequency tracking & correcting algorithm and its FPGA implementation structure in real-time.

3 Claims, 5 Drawing Sheets

ACTIVE SUPPRESSION CONTROLLER WITH TRACKING AND CORRECTION FOR MULTIPLE TIME-VARYING FUNDAMENTAL FREQUENCIES

TECHNICAL FIELD

The invention relates to the design of an active adaptive controller with a satisfied robustness and effectiveness to suppress undesired vibrations or noise with a multi-noise source based on the mechanism of mutual interference.

BACKGROUND ART

Basically, the narrow-band vibration or noise produced by an operating device is periodic. This kind of vibration or noise can be formed by the combination of the fundamental frequency and its harmonics. Generally, the fundamental frequency of harmonics is not stable, it is constantly disturbed.

The most widely used algorithm for controlling such periodic vibration and noise is the DXHS (Delayed-X Harmonic Synthesizer). Its outstanding advantage is that it does not require estimating the second path and the convergence is guaranteed. In the meantime, its fatal flaw is that it can't effectively track the fundamental frequency disturbance. The traditional DXHS algorithm is available only for invariant fundamental frequency while extended DXHS has a limited frequency tracking ability.

Meanwhile, even a tiny mismatch in fluctuation frequencies will not only significantly affect DXHS performance, it can even cause instability or divergence. In other words, the control performance of DXHS strongly depends on the proper frequency estimation.

Additionally, all DXHS algorithms only deal with one fundamental frequency. Usually, there are multiple radiation sources with time-variants, this situation corresponds to multiple fundamental frequencies with time-variants.

SUMMARY OF THE INVENTION

Figure 1:
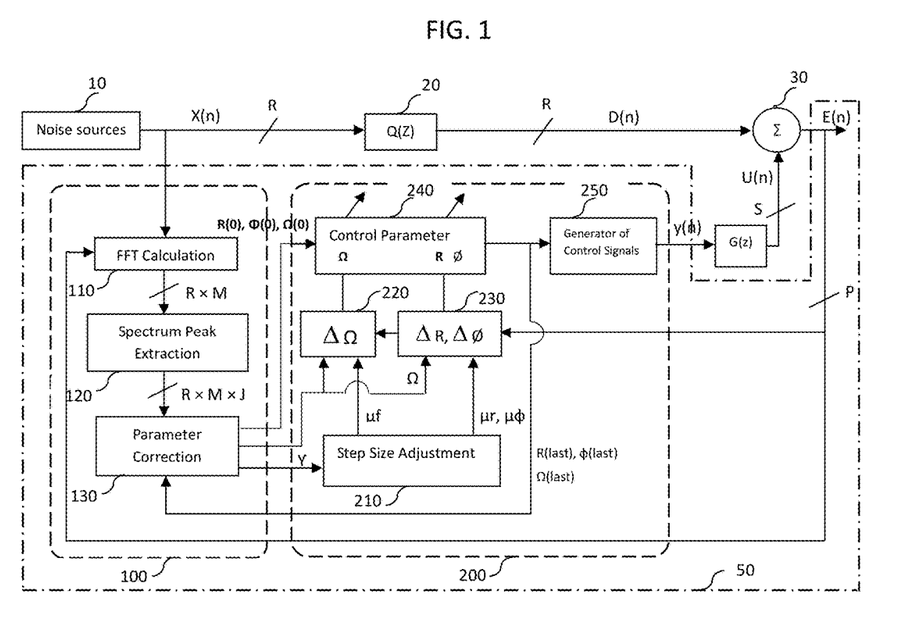
Figure 2A:
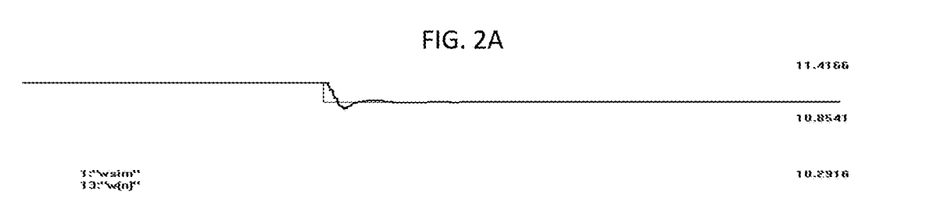
FIG. 2A illustrates two waveforms that correspond to a disturbance frequency and its tracking frequency in the case of a descending step disturbance of fundamental frequency. Therefore, the thin line represents the disturbance of fundamental frequency of the simulated noise source. The thick line represents the tracked frequency waveform. When the thin line has a falling step disturbance, the thick line can accurately track the falling step.
Figure 2B:
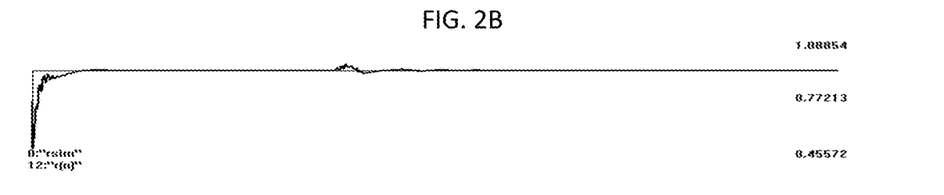
FIG. 2B illustrates two waveforms that correspond to a controlled signal amplitude parameter and its identifiable amplitude parameter in the case of a descending step disturbance of fundamental frequency. Therefore, the thin line represents an amplitude of fundamental frequency of the simulated noise source. The thick line represents the tracked amplitude waveform. There is little amount of tracking error which is detected when the fundamental frequency step disturbance occurs.
Figure 2C:
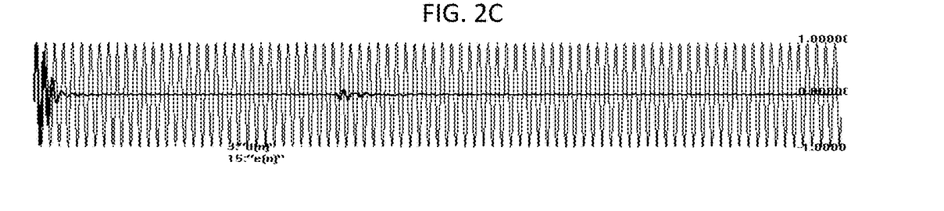
FIG. 2C illustrates two waveforms that correspond to a controlled signal and its residual signal (error) in the case of a descending step disturbance of fundamental frequency. Therefore, the thin line represents a time-domain noise signal waveform of a noise source, and the thick line represents a signal waveform of the error signal which being controlled. The error signal has a slight tracking error only when a fundamental frequency step disturbance occurs.
Figure 2D:
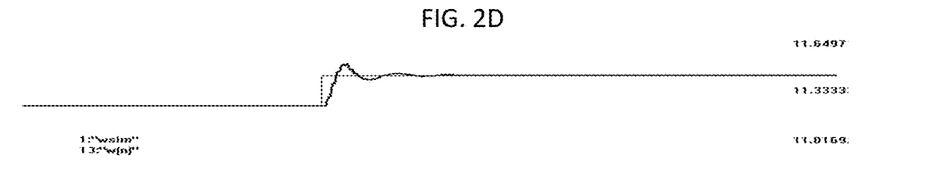
FIG. 2D illustrates two waveforms that correspond to a disturbance frequency and its tracking frequency in the case of an increasing step disturbance of fundamental frequency. Here, the thin line represents the disturbance waveform of the fundamental frequency of the noise source, and the thick line represents the tracked waveform of the fundamental frequency obtained by the tracking. When the thin line has a rising step disturbance, the thick line can accurately track this rising step.
Figure 2E:
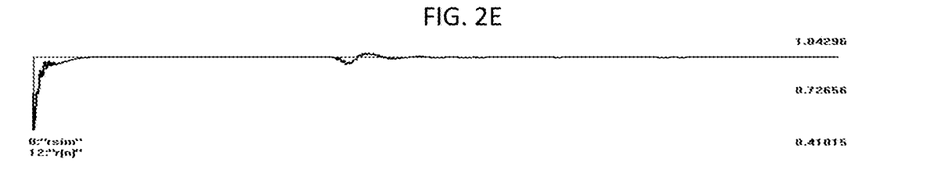
FIG. 2E illustrates two waveforms that correspond to a controlled signal amplitude parameter and its identifiable amplitude parameter in the case of an increasing step disturbance of fundamental frequency. Here, the thin line indicates the amplitude waveform of the noise source, and the thick line indicates the amplitude waveform obtained by tracking. It shows that only a small tracking error is found in the amplitude waveform when the fundamental frequency step disturbance occurs.
Figure 2F:
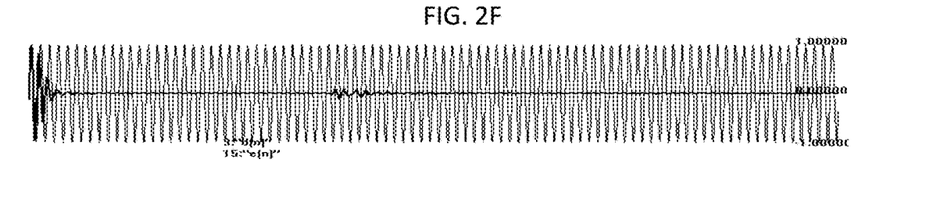
FIG. 2F illustrates two waveforms that correspond to a controlled signal and its residual signal (error) in the case of an increasing step disturbance of fundamental frequency.
Figure 3A:
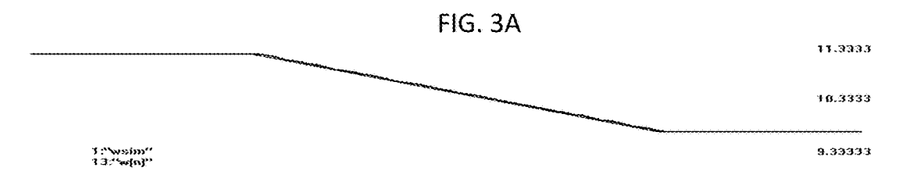
FIG. 3A illustrates two waveforms that correspond to a disturbance frequency and its tracking frequency in the case of a descending slope disturbance of fundamental frequency. Here, the thin line represents the disturbance waveform of the fundamental frequency of the noise source, and the thick line represents the tracked waveform of the fundamental frequency obtained by the tracking. When the thin line has a descending slope disturbance, the thick line can accurately track the descending slope disturbance.
Figure 3B:
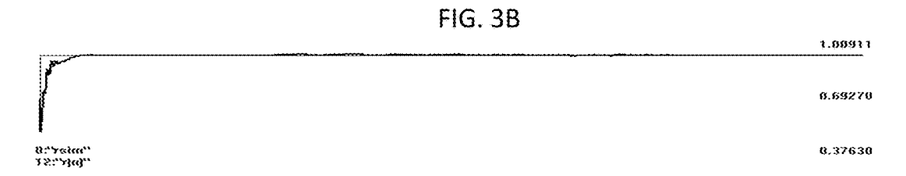
FIG. 3B illustrates two waveforms that correspond to a controlled signal amplitude parameter and its identifiable amplitude parameter in the case of a descending slope disturbance of fundamental frequency. Here, the thin line represents the amplitude waveform of the noise source, and the thick line represents the amplitude waveform obtained from tracking. It shows that when the fundamental frequency has a descending slope disturbance, the amplitude tracking error is very slight.
Figure 3C:
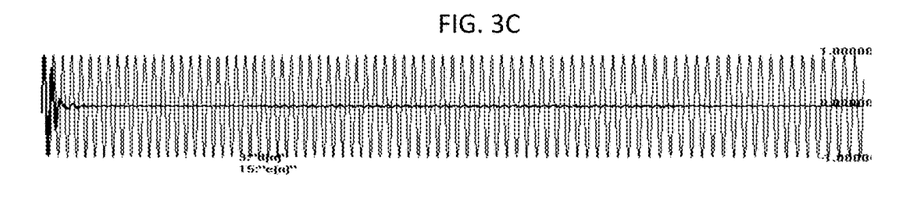
FIG. 3C illustrates two waveforms that correspond to a controlled signal and its residual signal (error) in the case of a descending slope disturbance of fundamental frequency. Here, the thin line represents the time domain noise signal waveform of the noise source, and the thick line represents the error signal waveform which is being controlled. It shows that the error signal tracking error is very small when the fundamental frequency has a descending slope disturbance.
Figure 3D:
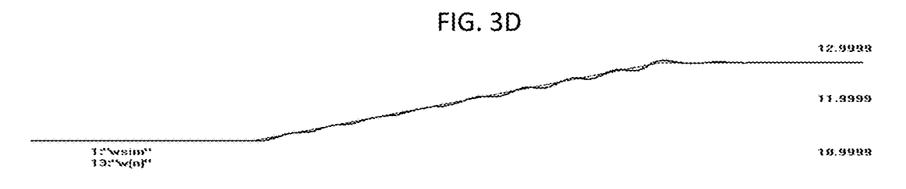
FIG. 3D illustrates two waveforms that correspond to a disturbance frequency and its tracking frequency in the case of an increasing slope disturbance of fundamental frequency. Here, the thin line represents the disturbance waveform of the fundamental frequency of the noise source, and the thick line represents the tracked waveform of the fundamental frequency obtained by the tracking. When the thin line has a rising slope disturbance, the thick line can accurately track the rising slope disturbance.
Figure 3E:
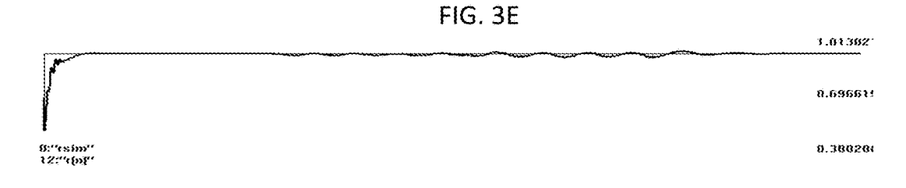
FIG. 3E illustrates two waveforms that correspond to a controlled signal amplitude parameter and its identifiable amplitude parameter in the case of an increasing slope disturbance of fundamental frequency. Here, the thin line indicates the amplitude waveform of the noise source, and the thick line indicates the amplitude waveform obtained by the tracking. It shows that when the fundamental frequency has a rising slope disturbance, the amplitude wave has little tracking error, when the disturbance stops, the tracking error disappears.
Figure 3F:
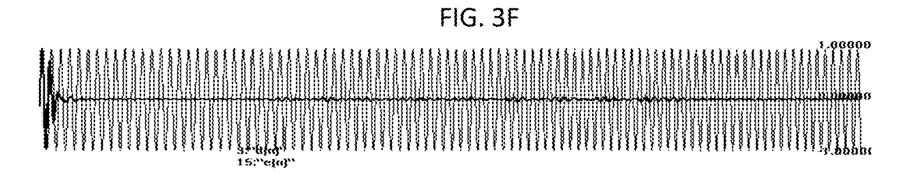
FIG. 3F illustrates two waveforms that correspond to a controlled signal and its residual signal (error) in the case of an increasing slope disturbance of fundamental frequency. Here, the thin line indicates the time domain noise signal waveform of the noise source, and the thick line indicates the error signal waveform which being controlled. It shows that when the fundamental frequency has a rising slope disturbance, the error signal has a slight tracking error, and once the disturbance stops, the tracking error disappears.
Figure 4A:
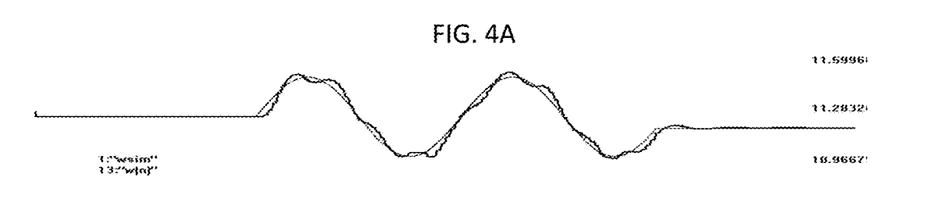
FIG. 4A illustrates two waveforms that correspond to a disturbance frequency and its tracking frequency in the case of period of sinusoidal disturbance of fundamental frequency. Here, the thin line represents the disturbance waveform of the fundamental frequency of the noise source, and the thick line represents the tracking waveform of the fundamental frequency obtained by tracking. When the thin line has a period of sinusoidal frequency disturbance, the thick line can track the frequency disturbance of the sinusoidal wave.
Figure 4B:
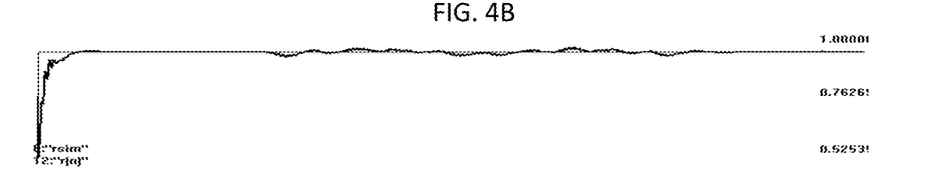
FIG. 4B illustrates two waveforms that correspond to a controlled signal amplitude parameter and its identifiable amplitude parameter in the case of a sine wave disturbance of fundamental frequency. Here, the thin line indicates the amplitude waveform of the noise source, and the thick line indicates the amplitude waveform obtained by tracking. It shows that when the fundamental frequency has a period of sinusoidal frequency disturbance, there is little tracking error in the amplitude waveform, and once the disturbance stops, the tracking error disappears.
Figure 4C:
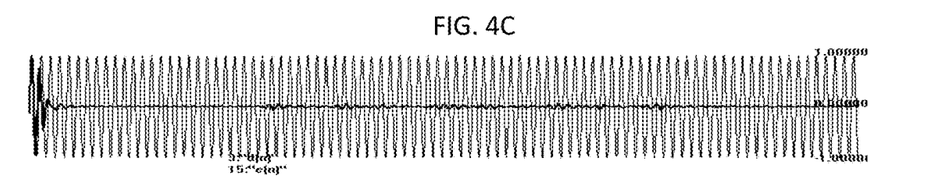
FIG. 4C illustrates two waveforms that correspond to a controlled signal and its residual signal (error) in the case of a sine wave disturbance of fundamental frequency. Here, the thin line represents the time domain noise signal waveform of the noise source, and the thick line represents the error signal waveform after it is controlled. It shows that when the fundamental frequency has a period of sinusoidal frequency disturbance, the error signal has little tracking error, once the disturbance stops, the tracking error disappears.

As shown in FIG. 1, the Controller 50 of the invention consists of two major parts of a Correction Unit 100 and a Tracking Unit 200. The Correction Unit 100 includes an FFT Calculation Module 110, a Spectrum Peak Extraction Module 120 and a Parameter Correction Module 130. The Tracking Unit 200 includes a Step Size Adjustment Module 210, a Frequency Updater Module 220, a R-Ø Updater Module 230, a Control Parameter Module 240 and Generator of Control Signals 250. The above two units cooperate in terms of the controller's initialization, step size adjustment, divergence judgment, divergence correction, frequency tracking and tracking accuracy calculation, etc. The invention proposes a control object noise model with multiple time-varying fundamental frequencies and its real-time algorithm scheme, including a real-time FPGA structure.

A Control object noise model of the present invention consists of harmonics of multiple fundamental frequencies and these fundamental frequencies can be tracked and corrected. An adaptive control algorithm for active suppression controller 50 of the present invention is below:

For multiple time-varying fundamental frequencies, output control signal in DXHS format is expressed as:

$$y(n) = \sum_{i=1}^{M}\sum_{k=1}^{J} r_{i,k}(n) \cdot \sin[k \cdot \omega_i(n) + L_{i,k} \cdot \varphi_{i,k}(n)] \quad 1$$

wherein:
M—Amount of the fundamental frequencies
J—Amount of harmonic for a fundamental frequency
$L_{i,k}$—Stability factor greater than one 1) Correction Unit 100
   a) FFT Calculation Module 110
      The Spectrums of the reference signal and the error signal are acquired in real-time by FFT transforming from the corresponding time-domain signals. Let the FFT spectrums of the reference signal x(n) and the error signal e(n) be expressed as:

$$S_x(m, \omega) = \sum_{n=0}^{N} x(n) \cdot wnd(n-m) \cdot e^{-jwn} \quad 2$$

$$S_e(m, \omega) = \sum_{n=0}^{N} e(n) \cdot wnd(n-m) \cdot e^{-jwn} \quad 3$$

Where, wnd(n−m) is a window function.

b) Spectrum Peak Extraction Module 120
      The frequencies and amplitudes at each peak point for the reference signal spectrum and the error signal spectrum are extracted in real-time as follows:
      $w_x(i,k)$—$k^{th}$ harmonic of $i^{th}$ fundamental frequency for $S_x(m,\omega)$;
      $w_e(i,k)$—$k^{th}$ harmonic of $i^{th}$ fundamental frequency for $S_e(m,\omega)$;
      $A_{w(i,k)}{}^x(m)$—spectrum amplitude at $w_x(i,k)$ for $S_x(m,\omega)$;
      $A_{w(i,k)}{}^e(m)$—spectrum amplitude at $w_e(i,k)$ for $S_e(m,\omega)$;

c) Parameter Correction Module 130
      The following calculated variables are stored in this—130 module:
      Default initial value of system parameters;

$$r_{i,k}(0) = \frac{2}{N} A^x_{\omega\_i,k}(0) \quad 4$$

$$\omega_{i,k}(0) = \omega^x_{i,k}(0) \quad 5$$

$$\varphi_{i,k}(0) = \varphi_{i,k}(\text{last}) \text{ or} \quad 6$$

$$r_{i,k}(0) = r_{i,k}(\text{last}) \quad 7$$

$$\omega_{i,k}(0) = \omega_{i,k}(\text{last}) \quad 8$$

$$\varphi_{i,k}(0) = \varphi_{i,k}(\text{last}) \quad 9$$

System control parameters at the newest converge;
Frequency, amplitude and its ratio of the reference signal spectrum and the error signal spectrum at each peak point for the newest spectrums;
Frequency tracking accuracy;
Divergence judgment and correction parameters Divergent Condition:

$$P_e(n) > P_{max}{}^e \text{ and } C_{continue} > C_{max} \quad 10$$

Wherein, $$P^e(n) = (1.0-\tau) \cdot P^e(n-1) + \tau \cdot e(n) \cdot (n) \quad 11$$

2) Tracking Unit 200
   a) Step Size Adjustment Module 210
      Based on the information of the parameter correction module, the step size convergence factor is calculated as follows:

$$\mu_{i,k}^r(n) = \mu^r \cdot \mu_{i,k}(n) \quad (12)$$

$$\mu_{i,k}^p(n) = \mu^p \cdot \mu_{i,k}(n) \quad (13)$$

$$\mu_{i,k}^f(n) = \mu^f \cdot \mu_{i,k}(n) \quad (14)$$

$$\mu_{i,k}(n) = \gamma_{i,k}(n) \cdot \mu_{i,k}^{min} + (1.0 - \gamma_{i,k}(n)) \cdot \mu_{i,k}^{max} \quad (15)$$

Wherein:
   $\mu_{i,k}^r(n)$—Amplitude convergence factor of $k^{th}$ harmonic of $i^{th}$ fundamental frequency;
   $\mu_{i,k}^p(n)$—Phase convergence factor of $k^{th}$ harmonic of $i^{th}$ fundamental frequency;
   $\mu_{i,k}^f(n)$—Frequency convergence factor of $k^{th}$ harmonic of $i^{th}$ fundamental frequency;
   $\mu_{i,k}(n)$—Convergence factor of $k^{th}$ harmonic of $i^{th}$ fundamental frequency;

$$\gamma_{i,k}(n) = P_{w(i,k)}^e(n) / P_{w(i,k)}^x \quad (16)$$

$$P_{w(ik)}^x(n) = (1.0 - \lambda) \cdot P_{w(ik)}^x(n-1) + \lambda \cdot A_{w(ik)}^x(n) \quad (17)$$

$$P_{w(ik)}^e(n) = (1.0 - \lambda) \cdot P_{w(ik)}^e(n-1) + \lambda \cdot A_{w(ik)}^e(n) \quad (18)$$

$$P_{w(ik)}^x(0) = 1.0 \quad (19)$$

$$P_{w(ik)}^e(0) = 1.0 \quad (20)$$

b) R-Ø Updater Module 230
   The incremental update steps are as follows:
   Parameter incremental calculation:

$$\Delta r_{i,k}(n+1) = -\mu_r \cdot e(n) \cdot \sin[k \cdot \omega_i(n) + \varphi_{i,k}(n)] \quad (21)$$

$$\Delta \varphi_{i,k}(n+1) = -\mu_p \cdot e(n) \cdot \cos[k \cdot \omega_i(n) + \varphi_{i,k}(n)] \quad (22)$$

$$\Delta \omega_i(n+1) = \omega_i(n) - \omega_i(n-1) \quad (23)$$

Average of variables for frequency tracking:

$$R_{i,k}(n+1) = \lambda_r \cdot R_{i,k}(n) + (1.0 - \lambda_r) \cdot |\Delta r_{i,k}(n+1)| \quad (24)$$

$$PH_{i,k}(n+1) = \lambda_p \cdot PH_{i,k}(n) + (1.0 - \lambda_p) \cdot \Delta \varphi_{i,k}(n+1) \quad (25)$$

$$\Omega_i(n+1) = \lambda_f \cdot \Omega_i(n) + (1.0 - \lambda_f) \cdot \Delta \omega_i(n+1) \quad (26)$$

Incremental update equations:

$$r_{i,k}(n+1) = r_{i,k}(n) + \Delta r_{i,k}(n+1) \quad (27)$$

$$\varphi_{i,k}(n+1) = \varphi_{i,k}(n) + \Delta \varphi_{i,k}(n+1) \quad (28)$$

c) Frequency Updater Module 220
   Frequency tracking equation:

$$\omega_i(n+1) = \omega_i(n) + \mu_f \cdot PH_{i,k}(n+1) + \mu_f^\omega \cdot \Omega_i(n+1) \quad (29)$$

Update Conditions:

$$R_{i,k}(n+1) \leq R_{i,k}^{max} \text{ (Amplitude is stable enough.)} \quad (30)$$

And $$r_{i,k}^{max} \geq r_{i,k}(n+1) \geq r_{i,k}^{min} \text{ (Amplitude varies within the valid range.)} \quad (31)$$

d) Control Parameter Module 240
   This module stores the newest control parameters for synthesis of control signal, and at the same time it feedbacks to the parameter correction module 130.
e) Generator of Control Signals Module 250
   This module outputs control signal which is expressed in the equation 1

BRIEF DESCRIPTION OF DRAWINGS

FIG. 1 is a block diagram illustrating the architecture of an active vibration noise controller of the invention. The controller comprises a correction unit and a tracking unit. The correction unit, which functions as controller's initialization, divergence judgement and divergence correction, is made up from a FFT Calculation Module, a spectrum Peak Extraction Module and a Parameter Correction Module. The tracking unit, which is for step size adjustment, average filtering, frequency tracking and tracking accuracy calculation, is equipped with a Step Size Adjustment Module, a Frequency Updater Module, R-Ø Updater Module, a Control Parameter Module and a Generator of Control Signal.

Here, the thin line represents the time domain noise signal waveform of the noise source, and the thick line represents the error signal waveform which is being controlled. It shows that the error signal has only a small amount of tracking error when the fundamental frequency step disturbance occurs.

REFERENCE MARKS IN THE DRAWINGS

10 Noise Source Signals
20 Propagation Path (Transfer Characteristics)
30 Evaluation Points
50 Active Suppression Controller
100 Correction Unit
110 FFT Calculation Module
120 Spectrum Peak Extraction Module
130 Parameter Correction Module
200 Tracking Unit
210 Step Size Adjustment Module
220 Frequency Updater Module
230 R-Ø Updater Module
240 Control Parameter Module
250 Generator of Control Signals
R—Dimension of array of reference sensor for noise source signals;
S—Dimension of array of speaker for secondary sound source;
P—Dimension of array of error sensor;
M—Amount of the fundamental frequencies;
J—Amount of harmonic for a fundamental frequency.
X(n) represents as R dimensional array of reference signal;
D(n) represents as R dimensional array of propagation signal needed to control;
E(n) represents as P dimensional array of error sensor;
Y(n) represents as S dimensional array of secondary sound source;

DESCRIPTION OF EMBODIMENTS

Hereinafter, a description is made for embodiments of the invention using related drawings.

FIG. 1 is a block diagram illustrating an architecture of an active vibration noise controller 50 according to an embodiment of the invention. It is depicted below.

The controller 50 comprises a correction unit 100 and a tracking unit 200. The correction unit 100, which functions as controller's initialization, divergence judgement and divergence correction, is made up from a FFT Calculation Module 110, a spectrum Peak Extraction Module 120 and a Parameter Correction Module 130. The tracking unit 200, which is for step size adjustment, average filtering, frequency tracking and tracking accuracy calculation, and is equipped with a Step Size Adjustment Module 210, a Frequency Updater Module 220, R-Ø Updater Module 230, a Control Parameter Module 240 and a Generator of Control Signals 250. The R-Ø Updater Module 230 is supplied with two step size parameters, the fundamental frequencies and the error signal updates ΔR and ΔØ and average variables for Frequency Updater Module 220 which is supplied with a step size parameters, fundamental frequencies and updates ΔΩ. This calculation process is based on above mentioned adaptive control algorithm for minimizing the tracking error. The module 250 is for producing signals for generating sounds to suppress the vibration noise at the evaluation points. At each evaluation point, an error signal detector (an accelerometer or microphone) will acquire a residual of interference between the vibration noise and the second source (generated for suppressing vibration noise). With FIG. 1 configuration. theoretically, enabling the vibration noise to be silenced at the position of the evaluation points regardless of the fluctuation of multi-fundamental frequencies.

The controller's operation includes three processes as following:

1. The Controller's startup Initialization Process

When the controller starts to work, it first sets all control output to zero, meaning that the it does not control anything. Then, the reference signal X(n) acquired form noise source and the error signal E(n) acquired from the evaluation point are FFT-transformed in real time by 110 (FFT Calculation Module) according to Equation 2~3, respectively. Then 120 (Spectrum Peak Extraction) extracts the fundamental frequency Ω(n), and the spectral amplitude R(n) and spectrum phase Ø(n) information corresponding to the fundamental frequency from the obtained FFT spectrum according to Equation 4~9, and passes them to 130 (Parameter Correction Module). 130 stores the controller's amplitude information R(last) and phase information φ(last) at the latest convergence. The Ω(n), R(last) and φ(last) has been sent to 240 (Control Parameter Module) as Ω(0), R(0) and Ø(0) to initialize the control parameters. At same time, based on the obtained spectrum amplitude R(n) 130 calculates ratio γ for 210 (Step Size Adjustment Module) which will calculate the initialization step size according to Equation 12~20. At this point, the initialization process is completed.

2. The controller's frequency tracking process

During the entire control process of the controller, 110 (FFT Calculation Module) performs FFT transformation for the reference signal X(n) of the noise source and the error signal E(n) of the evaluation point in real time according to Equation 2~3 respectively, and 120 (Spectrum Peak Extraction Module) acquires the amplitude information of each fundamental frequency and its corresponding harmonics in real time from the obtained FFT spectrum according to Equations 4~9, and calculate the ratio Y of each fundamental frequency and corresponding its harmonic according to Equations 16~20. These variables of Y are passed to the 210 (Step Adjustment Module) module. Having the Y, the step size adjustment parameters μf, ur, uφ of each fundamental frequency and corresponding its harmonics are calculated in real time according to Equations 12~15 by 130 (Parameter Correction), and then 230 (R-Ø Updater Module) calculate the amplitude increments ΔR and phase increments ΔØ of each fundamental frequency and its corresponding harmonics in real time according to Equation 21~23, and further calculates the smoothing filter variables according to Equation 24~26. Then 230 (R-Ø Updater Module) calculates the updated amplitude variable R and the phase variable Ø according to Equation 27~28. Using Equations 29~31 by 220 (Frequency Updater Module) to calculate the tracking variable Ω of the fundamental frequency. Finally, according to the Equations 10~11, determine whether or not the controller converges. If the controller converges, having stored the updated amplitude variables R(last) and phase variables Ø(last) and variable Ω(last), these parameters will be used in the controller's initialization for the next time.

3. The Divergence judgment and its correction processing

During the entire control process of the controller operation, the energy of the error signal E(n) is monitored in real time by 130 (Parameter Correction Module) according to Equation 10~11 to determine whether or not the energy of the error signal continuously exceeds the specified threshold for a given period. if it does exceed, it is considered to be divergence of controller. Once the divergence occurs (divergence has been captured), 130 (Parameter Correction Module) will immediately correct the controller. This process is the same as the controller startup initialization process. That is, using the spectrum information Ω(n) of the newly acquired frequency information from reference signal X(n), and latest previous divergence information–the amplitude R(last) and the phase Ø(last) to correct control parameter in 240 (Control Parameter Module), this is equivalent to reinitialize the controller.

4. FPGA algorithm acceleration module

Figure 5:
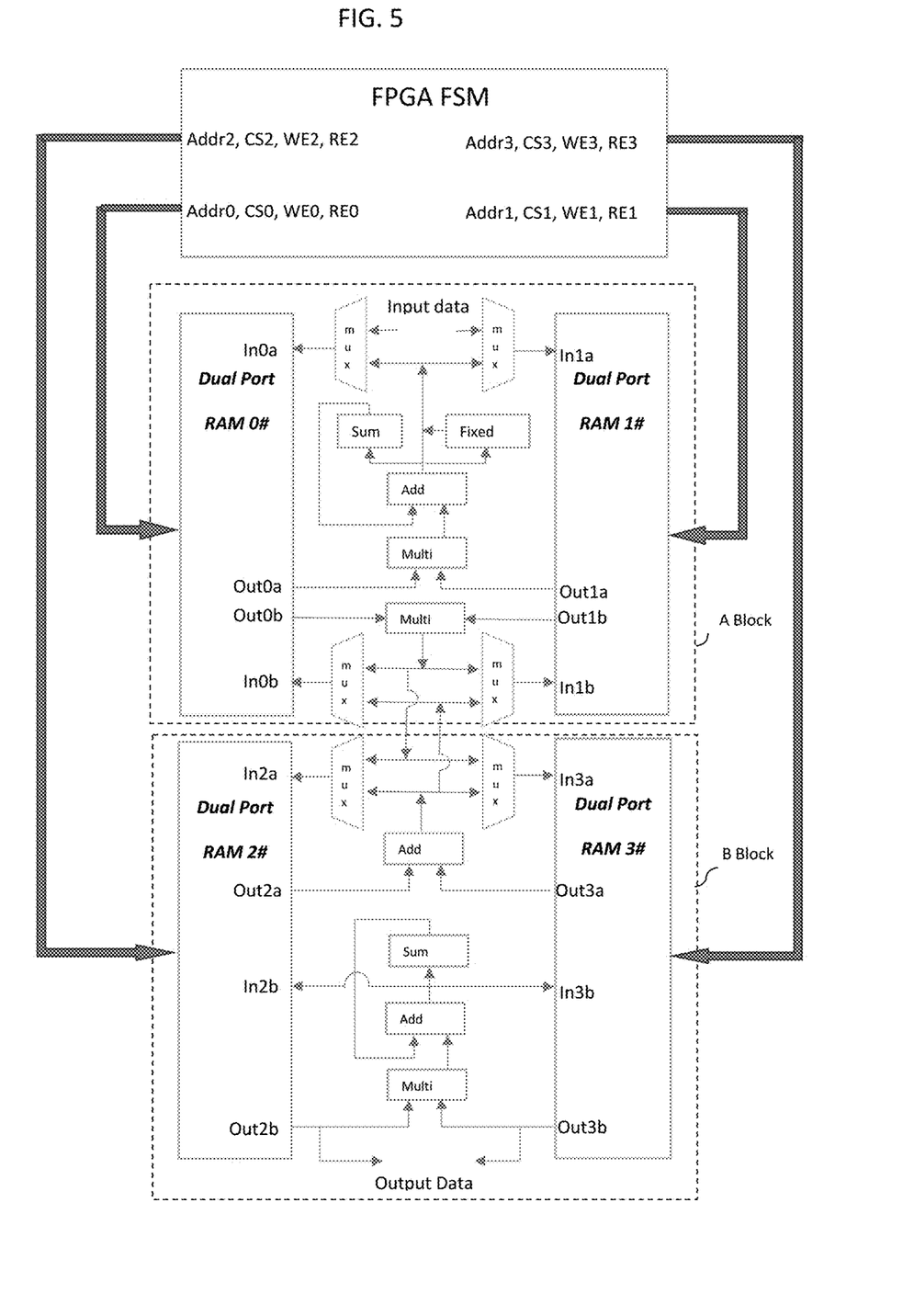
FIG. 5 illustrates block diagram of FPGA algorithm acceleration module in real-time. The acceleration module consists of algorithm A block and algorithm B block, and the calculation data can be exchanged between A block and B block. Each algorithm block consists of two dual-port RAMs, and several multipliers and adders. This structure can execute three parallel algorithmic calculation processes at the same time, and whole calculation processing is controlled by the FSM (Finite State Machine) located above the drawing.

In order to guarantee the invention algorithm in real-time, a FPGA (field-programmable gate array) algorithm acceleration module is proposed. A structured diagram of FPGA algorithm acceleration module is illustrated in FIG. 5 and is descripted as follows:

The acceleration module consists of algorithm A block and algorithm B block, and the calculation data can be exchanged between A block and B block. Each algorithm block consists of two dual-port RAMs, and several multipliers and adders. The proposed structure can execute at least three parallel algorithmic calculation processes at the same time, and all calculating processes are controlled by the FSM (Finite State Machine) located above the drawing of FIG. 5.

What is claimed is:

1. An active noise or vibration suppression method comprising:

a correction unit configured to calculate in real-time a convergence ratio, a divergence judgment and a set of correction parameters under condition of initialization and divergence based on a plurality of peak-points each of which corresponds to a peak in two spectrums acquired simultaneously from reference signals and error signals respectively, a tracking unit configured to perform in real-time a frequency tracking for fluctuation of frequencies and an incremental updating for amplitude-phases using coefficients of frequency tracking step size and amplitude-phase updating step size which are being adjusted by said convergence ratio, and in real-time a control correcting under said condition of initialization and divergence with said set of correction parameters, and an actuation unit configured to generate a plurality of control outputs each of which produces a destructive interference based on output of said tracking unit.

2. The method of claim 1, wherein said frequency tracking for fluctuation of frequencies is an adaptive frequency tracking algorithm which is achieved by weighting an average filtering phase and an average filtering frequency with respective coefficients of phase tracking step size and frequency tracking step size which will determine stability, speed and accuracy of said frequency tracking.

3. The method of claim 2, wherein further said adaptive frequency tracking algorithm has a means for in real-time computing using an FPGA (Field Programmable Gate Array) which is comprising an FSM (Finite State Machine) and a plurality of parallel computing blocks each of which contains more than one hardware dual-port RAMs (Random-Access Memory), a plurality of hardware multipliers and a plurality of hardware adders.

* * * * *